US010070542B2

(12) United States Patent
Ito

(10) Patent No.: US 10,070,542 B2
(45) Date of Patent: Sep. 4, 2018

(54) ELECTRONIC-CIRCUIT UNIT AND MANUFACTURING METHOD THEREOF

(71) Applicant: YAZAKI CORPORATION, Tokyo (JP)

(72) Inventor: Ken Ito, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 15/163,978

(22) Filed: May 25, 2016

(65) Prior Publication Data

US 2016/0278219 A1    Sep. 22, 2016

Related U.S. Application Data

(63) Continuation of application No. PCT/JP2014/082939, filed on Dec. 12, 2014.

(30) Foreign Application Priority Data

Dec. 26, 2013  (JP) .................................. 2013-269828
Dec. 26, 2013  (JP) .................................. 2013-269829

(51) Int. Cl.
  *H05K 5/00*  (2006.01)
  *H05K 3/22*  (2006.01)
  (Continued)

(52) U.S. Cl.
  CPC ............. *H05K 5/0034* (2013.01); *H05K 3/22* (2013.01); *H05K 3/284* (2013.01); *H05K 5/0226* (2013.01);
  (Continued)

(58) Field of Classification Search
  CPC ...... H05K 1/189; H05K 1/028; H05K 3/4691; H05K 2201/0999; H05K 5/0043;
  (Continued)

(56) References Cited

U.S. PATENT DOCUMENTS 4,958,260 A * 9/1990 Kobayashi ........... H05K 1/0284
                                                    361/748
5,434,362 A * 7/1995 Klosowiak ............. H05K 1/028
                                                    174/254
(Continued)

FOREIGN PATENT DOCUMENTS

CN         1722431 A     1/2006
JP     2000-134766 A     5/2000
(Continued)

OTHER PUBLICATIONS

Chinese Office Action for the related Chinese Patent Application No. 201480064200.1 dated Mar. 22, 2017.
(Continued)

*Primary Examiner* — James Wu
*Assistant Examiner* — Michael Matey
(74) *Attorney, Agent, or Firm* — Kenealy Vaidya LLP

(57) ABSTRACT

An electronic circuit unit in which a mold exclusion part, having a rear surface side covered by mold resin and a front surface side exposed from an outer case, is provided at a part of a plate surface of a circuit board which is mounted with electronic components and is covered by the outer case formed by the mold resin. The outer case is multi-material molded using plural kinds of resin having different fluidities. A rear wall of the outer case located on the rear surface side of the mold exclusion part is made of one of the plural kinds of the resin having a fluidity higher than a fluidity of another one of the plural kinds of the resin constituting the other portion of the outer case.

9 Claims, 12 Drawing Sheets

(51) Int. Cl.
*H05K 5/02* (2006.01)
*H05K 3/28* (2006.01)

(52) U.S. Cl.
CPC ......... *H05K 5/0239* (2013.01); *H05K 5/0247* (2013.01); *H05K 2201/0989* (2013.01); *H05K 2201/09736* (2013.01); *H05K 2201/09781* (2013.01); *H05K 2201/09972* (2013.01); *H05K 2201/2009* (2013.01); *H05K 2203/1316* (2013.01); *H05K 2203/1327* (2013.01)

(58) Field of Classification Search
CPC . H05K 2201/09118; H05K 2203/1316; H05K 2203/1327; H05K 1/0203; H05K 1/0212; G06F 1/16; G06F 1/181
See application file for complete search history.

(56) References Cited

U.S. PATENT DOCUMENTS

| | | | |
|---|---|---|---|
| 7,576,991 | B2 | 8/2009 | Naritomi |
| 2002/0002961 | A1 | 1/2002 | Yuasa et al. |
| 2006/0012034 | A1* | 1/2006 | Kadoya ................ H05K 1/0203 257/712 |
| 2009/0256282 | A1* | 10/2009 | Olaru .................... B29C 45/322 264/328.8 |
| 2011/0205701 | A1* | 8/2011 | Kanzaki ................ B60R 25/00 361/689 |
| 2012/0295374 | A1* | 11/2012 | Hayashi ............. B29C 45/0025 438/26 |
| 2013/0028998 | A1* | 1/2013 | Maekawa ............ H01L 21/565 425/129.1 |
| 2013/0109203 | A1* | 5/2013 | Nakanishi ........... B29C 45/1671 439/65 |

FOREIGN PATENT DOCUMENTS

| | | |
|---|---|---|
| JP | 2002-27636 A | 1/2002 |
| JP | 2002-56769 A | 2/2002 |
| JP | 2012-977 A | 1/2012 |

OTHER PUBLICATIONS

International Search Report and Written Opinion of the International Search Report for PCT/JP2014/082939 dated Mar. 17, 2015.
English language Written Opinion of the International Search Report for PCT/JP2014/082939 dated Mar. 17, 2015.

* cited by examiner

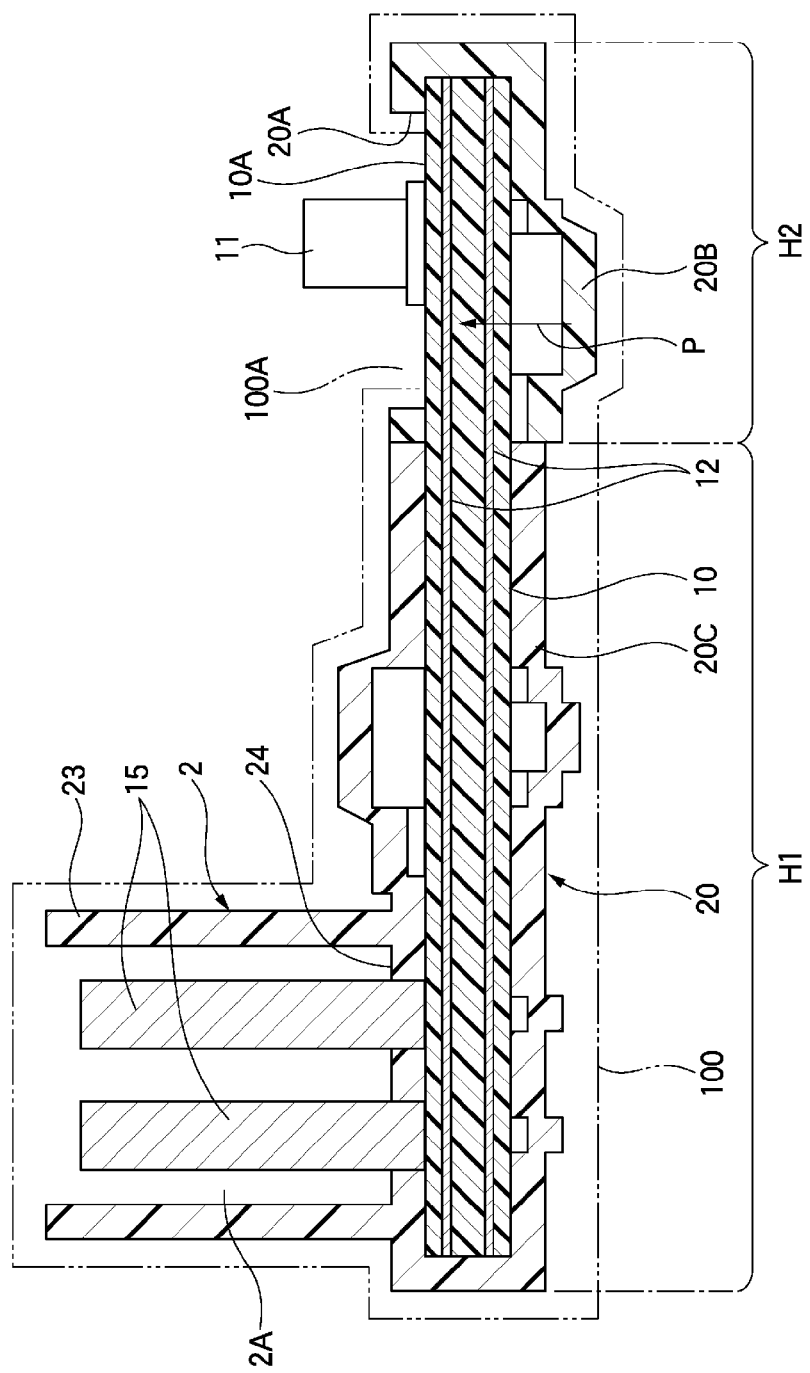

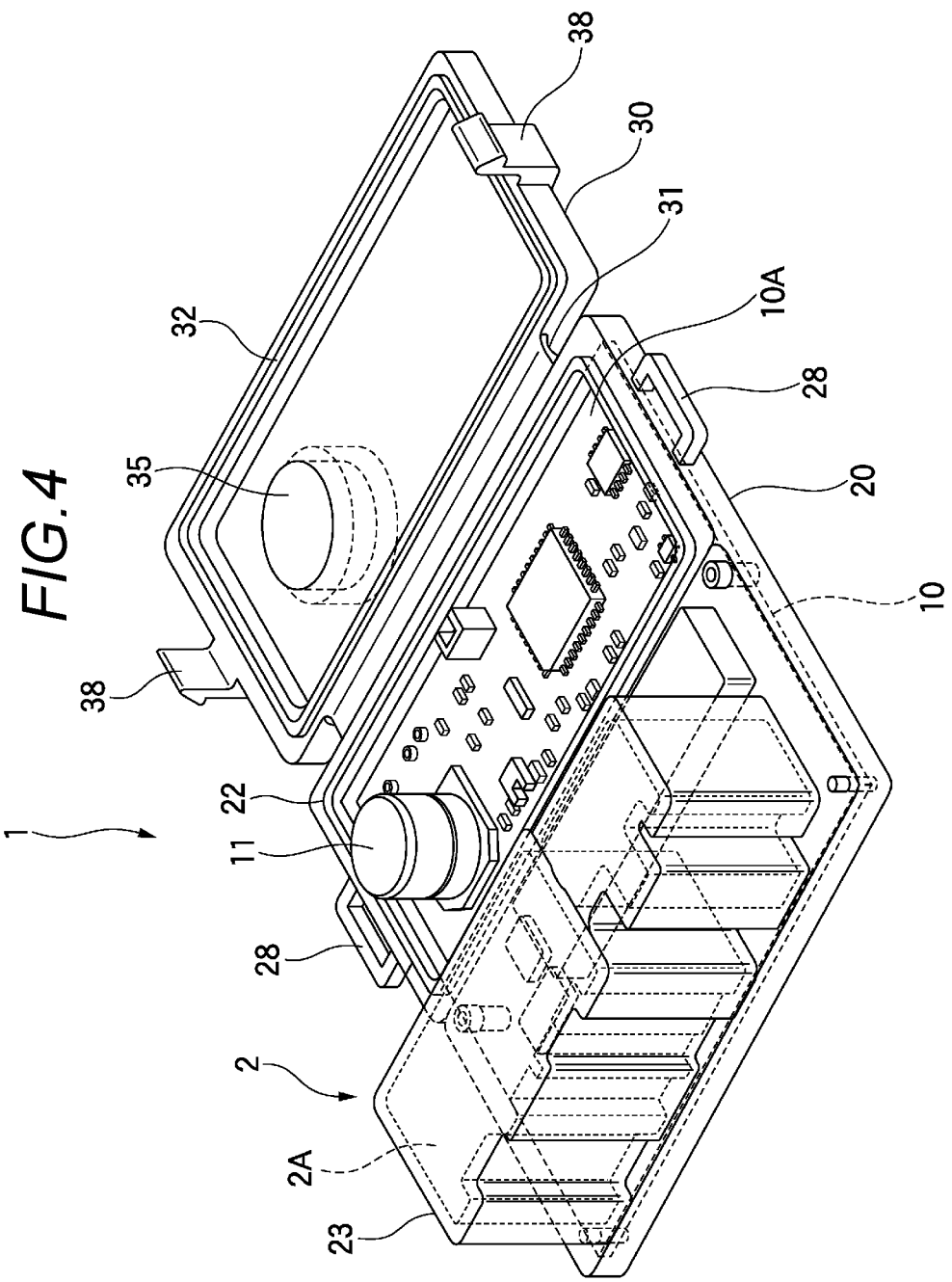

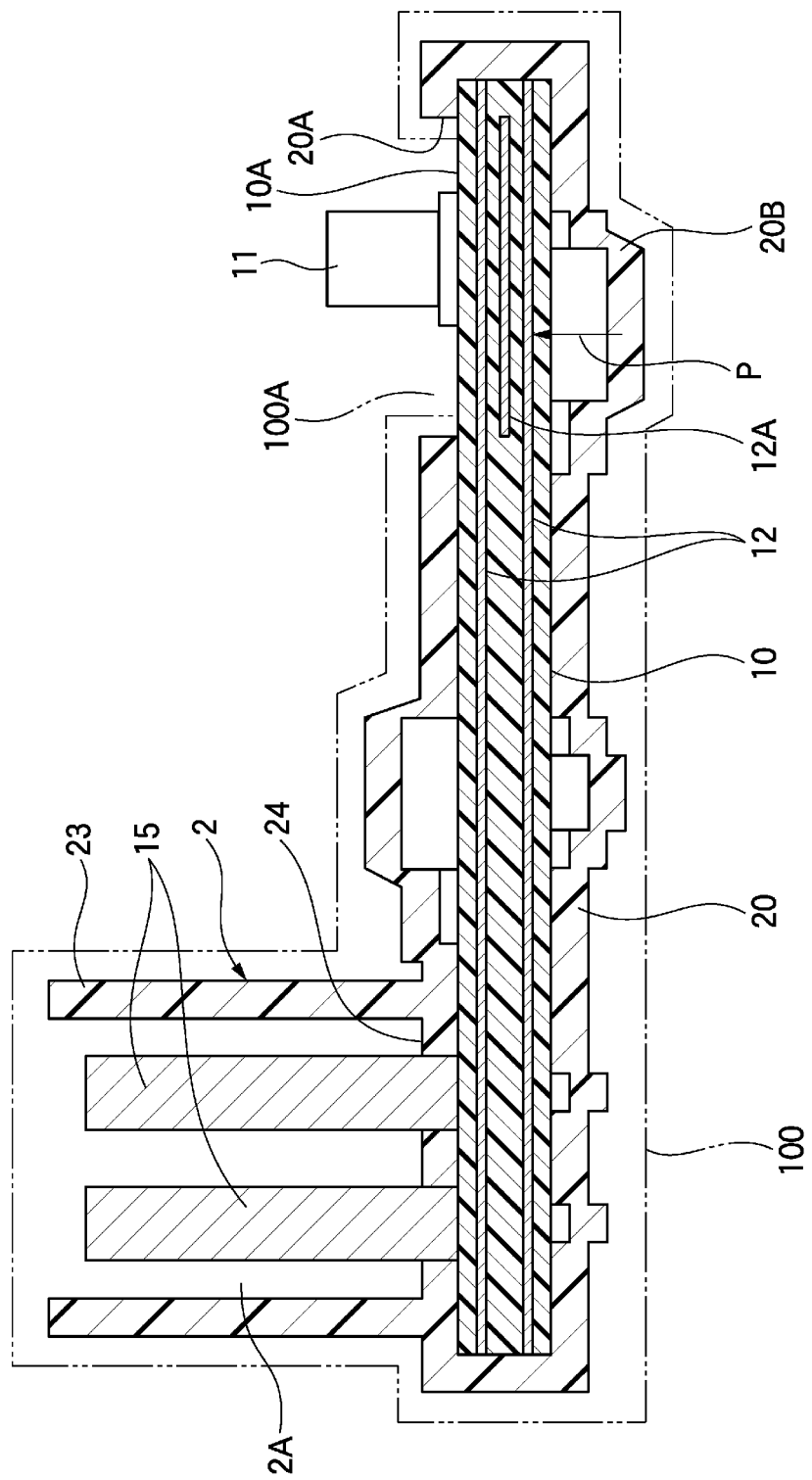

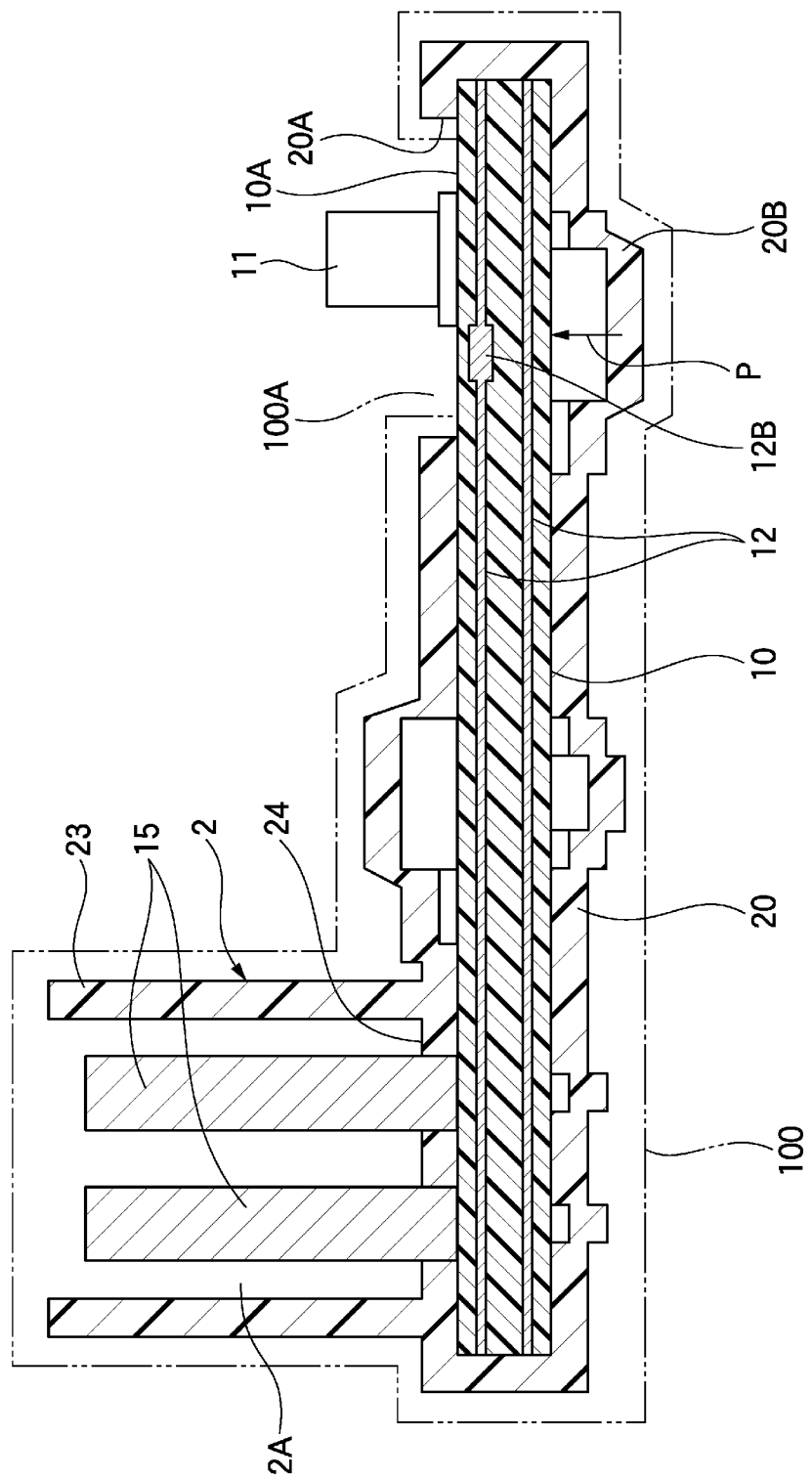

ELECTRONIC-CIRCUIT UNIT AND MANUFACTURING METHOD THEREOF

CROSS REFERENCE TO RELATED APPLICATIONS

This application is a continuation of PCT application No. PCT/JP2014/082939, which was filed on Dec. 12, 2014 based on Japanese Patent Application (No. 2013-269828) filed on Dec. 26, 2013 and Japanese Patent Application (No. 2013-269829) filed on Dec. 26, 2013, the contents of which are incorporated herein by reference.

BACKGROUND OF THE INVENTION

Field of the Invention

The present invention relates to an electronic circuit unit applied, for example, to an electronic control unit (ECU) or the like for an automobile, in particular, to an electronic circuit unit in which an outer case is formed integrally with a circuit board by mold resin and also relates to a manufacturing method thereof.

Description of Related Art

In a case where a circuit board (a printed wiring board, a bus bar wiring board or the like) mounting electronic components thereon is modularized as a single electronic circuit unit equipped with a connector, etc., in general, the electronic circuit unit has been configured by incorporating the circuit board into a hard case made of resin molded separately (see a patent literature 1: JP-A-2000-134766).

However, in a case where the electronic circuit unit is configured in such the manner, the number of the components and a cost of the assembling become large.

Thus, it has been considered to set a circuit board mounting electronic components thereon within a die and form an outer case by insert molding using thermoplastic resin. In a case of forming the outer case by the insert molding using the mold resin in this manner, it is not necessary to separately mold a hard case using resin and incorporate the circuit board within the hard case. As a result, the number of the components can be reduced and the assembling work can be eliminated advantageously.

[Patent Literature 1: JP-A-2000-134766]

However, in the case of setting the circuit board within the die and molding the outer case, it is required not to apply a pressure against electronic components (for example, an electrolytic capacitor, an oscillator, a filter, etc.) which are intolerant of a pressure of the resin (in particular, a filling pressure of the resin into the die) for the molding.

In terms of this, consideration is made that the electronic components intolerant of a pressure of the resin for the molding are collectively arranged at a particular portion on the circuit board, then the circuit board is set in the die in a state of exposing the particular portion outside the die, and the outer case is formed by injection molding.

However, it has been proved that, if the outer case is molded in this manner, the circuit board may be deformed due to a pressure of the resin for the molding acting on a rear surface side of the exposed portion, and hence conductor wiring patterns, an electronic circuit, etc. of an inner layer of the board may be damaged.

The invention is contrived in view of the aforesaid circumstances and an object of the invention is to provide an electronic circuit unit and a manufacturing method thereof which can suppress damage of a circuit board and an electronic circuit caused at a time of forming an outer case by injection molding.

SUMMARY

In an aspect (1), one or more embodiments provide an electronic circuit unit in which a mold exclusion part, having a rear surface side covered by mold resin and a front surface side exposed from an outer case, is provided at a part of a plate surface of a circuit board which is mounted with electronic components and is covered by the outer case formed by the mold resin. The outer case is multi-material molded using plural kinds of resin having different fluidities. A rear wall of the outer case located on the rear surface side of the mold exclusion part is made of one of the plural kinds of the resin having a fluidity higher than a fluidity of another one of the plural kinds of the resin constituting the other portion of the outer case.

In an aspect (2), a connector housing may be integrally provided with the outer case.

In an aspect (3), a lid which integrally may covers the mold exclusion part is provided with the outer case via a hinge.

In an aspect (4), one or more embodiments provide an electronic circuit unit in which a mold exclusion part, having a rear surface side covered by mold resin and a front surface side exposed from an outer case, is provided at a part of a plate surface of a circuit board which is mounted with electronic components and is covered by the outer case formed by the mold resin. A strength increasing part is provided at an inner layer in the mold exclusion part of the circuit board for suppressing deformation of the circuit board due to a pressure of resin in injection molding of the outer case.

In an aspect (5), a reinforcement conductor pattern not having a function as a conductor wiring part may be provided at the inner layer in the mold exclusion part of the circuit board, as the strength increasing part.

In an aspect (6), a thickness increasing part may be provided at a part of conductor wring pattern located on the inner layer in the mold exclusion part of the circuit board, as a strength increasing part. The thickness increasing part is in which a thickness of the conductor wring pattern increases locally.

In an aspect (7), a connector housing may be integrally provided with the outer case.

In an aspect (8), a lid which integrally may covers the mold exclusion part is provided with the outer case via a hinge.

According to the aspect (1), as the resin having a fluidity higher than that of the resin constituting the other portion of the outer case is used as the resin constituting the rear wall of the outer case located on the rear surface side of the mold exclusion part, a pressure due to the resin acting on the circuit board at the mold exclusion part in injection molding of the outer case can be reduced. Thus, deformation of the circuit board due to the pressure of the resin can be suppressed, and hence damage of the circuit board and an electronic circuit can be suppressed. Further, as the outer case is formed by the multi-material molding using the plural kinds of resin having different fluidities, specific properties of the respective resin can be utilized at the respective portions of the outer case while suppressing an entire cost.

According to the aspect (2), as the connector housing is integrally provided with the outer case, a connector is not required to be assembled independently.

According to the aspect (3), as the outer case is provided via the hinge with the lid which integrally covers the mold exclusion part, the mold exclusion part can be protected by the lid without increasing the number of components.

According to the aspect (4), as the strength increasing part is provide at the inner layer in the mold exclusion part of the circuit board, the deformation of the circuit board due to the pressure of the resin for the injection molding of the outer case can be suppressed and the damage of the circuit board and the electronic components can be suppressed.

According to the aspect (5), the dummy reinforcement conductor pattern not having the function as the conductor wiring part is provided at the inner layer in the mold exclusion part of the circuit board, as the strength increasing part. Thus, the deformation of the circuit board upon the injection molding of the outer case can be suppressed and heat-generation suppression effect of the circuit board can be enhanced.

According to the aspect (6), the thickness increasing part, formed by locally increasing the thickness of the conductor wring pattern, is provided at the part of the conductor wring pattern located on the inner layer in the mold exclusion part of the circuit board, as the strength increasing part. Thus, by merely changing the thickness of the part of the conductor wring pattern, the damage of the circuit board and the electronic components upon the injection molding of the outer case can be suppressed.

According to the aspect (7), as the connector housing is integrally provided with the outer case, a connector is not required to be assembled independently.

According to the aspect (8), as the outer case is provided via the hinge with the lid which integrally covers the mold exclusion part, the mold exclusion part can be protected by the lid without increasing the number of components.

In an aspect (9), one or more embodiments provide a manufacturing method for an electronic circuit unit in which a mold exclusion part, having a rear surface side covered by mold resin and a front surface side exposed from an outer case, is provided at a part of a plate surface of a circuit board which is mounted with electronic components and is covered by the outer case formed by the mold resin. According to the manufactured by:

setting the circuit board within a die; and multi-material molding the outer case using plural kinds of resin having different fluidities at a time of filling molten resin in a cavity within the die for injection molding the outer case. One of the plural kinds of the resin having a fluidity higher than a fluidity of another one of the plural kinds of the resin constituting the other portion of the outer case is used, as the resin constituting a rear wall of the outer case located on the rear surface side of the mold exclusion part.

According to the aspect (9), the outer case is formed by the multi-material molding using the plural kinds of resin having different fluidities in a manner of using, as the resin constituting the rear wall of the outer case located on the rear surface side of the mold exclusion part, the resin having a fluidity higher than that of the resin constituting the other portion of the outer case. By doing so, a pressure due to the resin acting on the circuit board at the mold exclusion part in injection molding of the outer case can be reduced. Thus, deformation of the circuit board due to the pressure of the resin can be suppressed, and hence damage of the circuit board and an electronic circuit can be suppressed. Further, as the outer case is formed by the multi-material molding using the plural kinds of resin having different fluidities, properties of the respective resin can be utilized at the respective portions of the outer case while suppressing an entire cost.

According to one or more embodiments, the pressure due to the resin acting on the circuit board at the mold exclusion part in injection molding of the outer case can be reduced. Thus, the deformation of the circuit board due to the pressure of the resin can be suppressed, and hence the damage of the circuit board and the electronic circuit can be suppressed. Further, as the outer case is formed by the multi-material molding using the plural kinds of resin having different fluidities, specific properties of the respective resin can be utilized at the respective portions of the outer case while suppressing an entire cost.

Further, according to one or more embodiments, as the strength increasing part is provide in the inner layer in the mold exclusion part of the circuit board, the deformation of the circuit board due to the pressure of the resin for the injection molding of the outer case can be suppressed and the damage of the circuit board and the electronic components can be suppressed.

The invention is explained above briefly. Details of the invention will be further clarified by thoroughly reading modes for carrying out the invention (hereinafter referred to as "embodiments") explained below with reference to accompanying drawings.

BRIEF DESCRIPTION OF THE DRAWINGS

FIG. 3 is a sectional view taken along line in FIG. 2A.

FIG. 4 is an external perspective view of an electronic circuit unit according to the second embodiment of the invention.

FIG. 6 is a sectional view taken along line VI-VI in FIG. 5A.

FIG. 7 is a sectional view of a portion, similar to that shown in FIG. 6, of the electronic circuit unit according to the third embodiment of the invention.

DETAILED DESCRIPTION

An Exemplary embodiment will be explained with reference to drawings.

Figure 1:
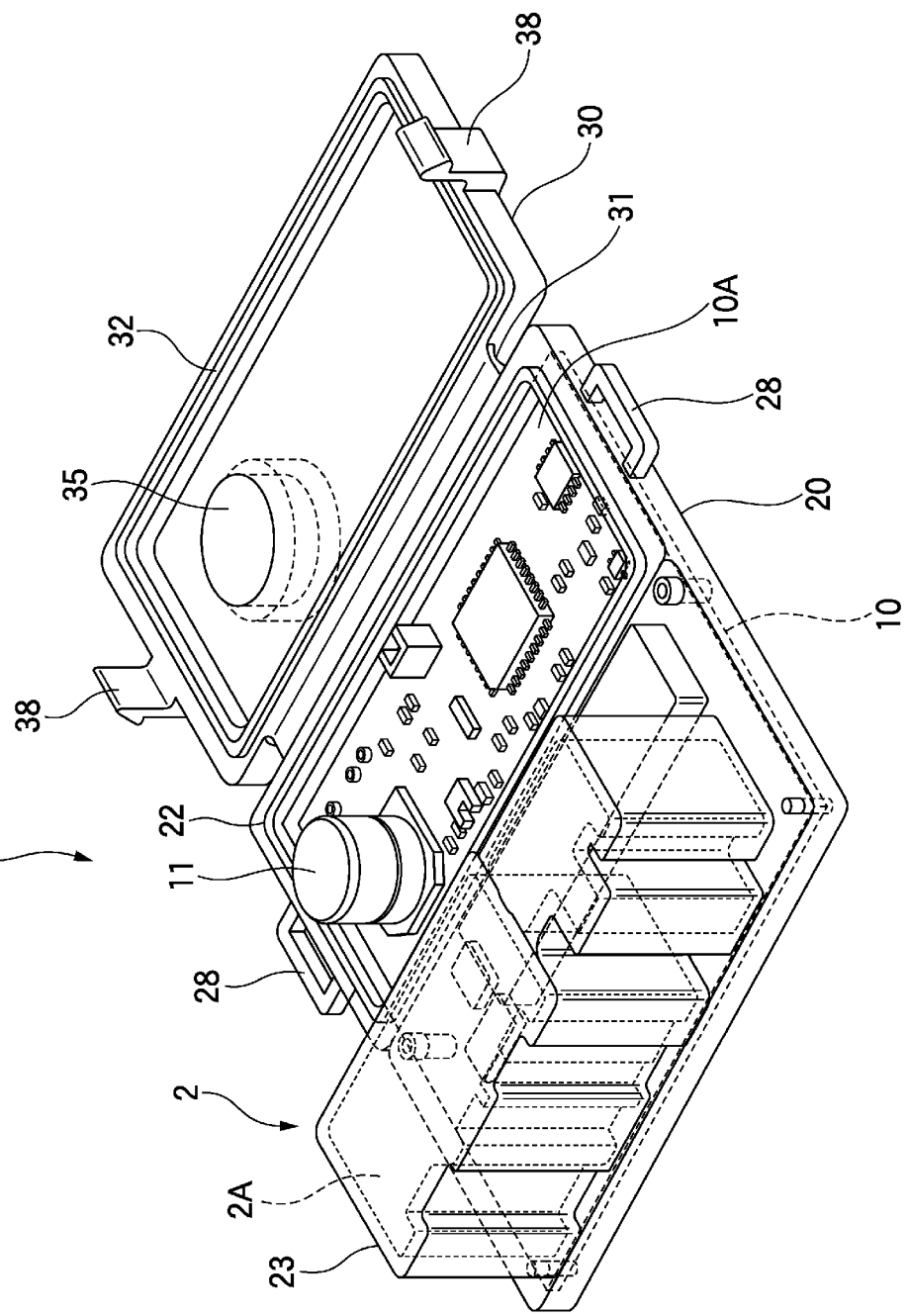
FIG. 1 is an external perspective view of an electronic circuit unit according to the first embodiment of the invention.
Figure 2A:
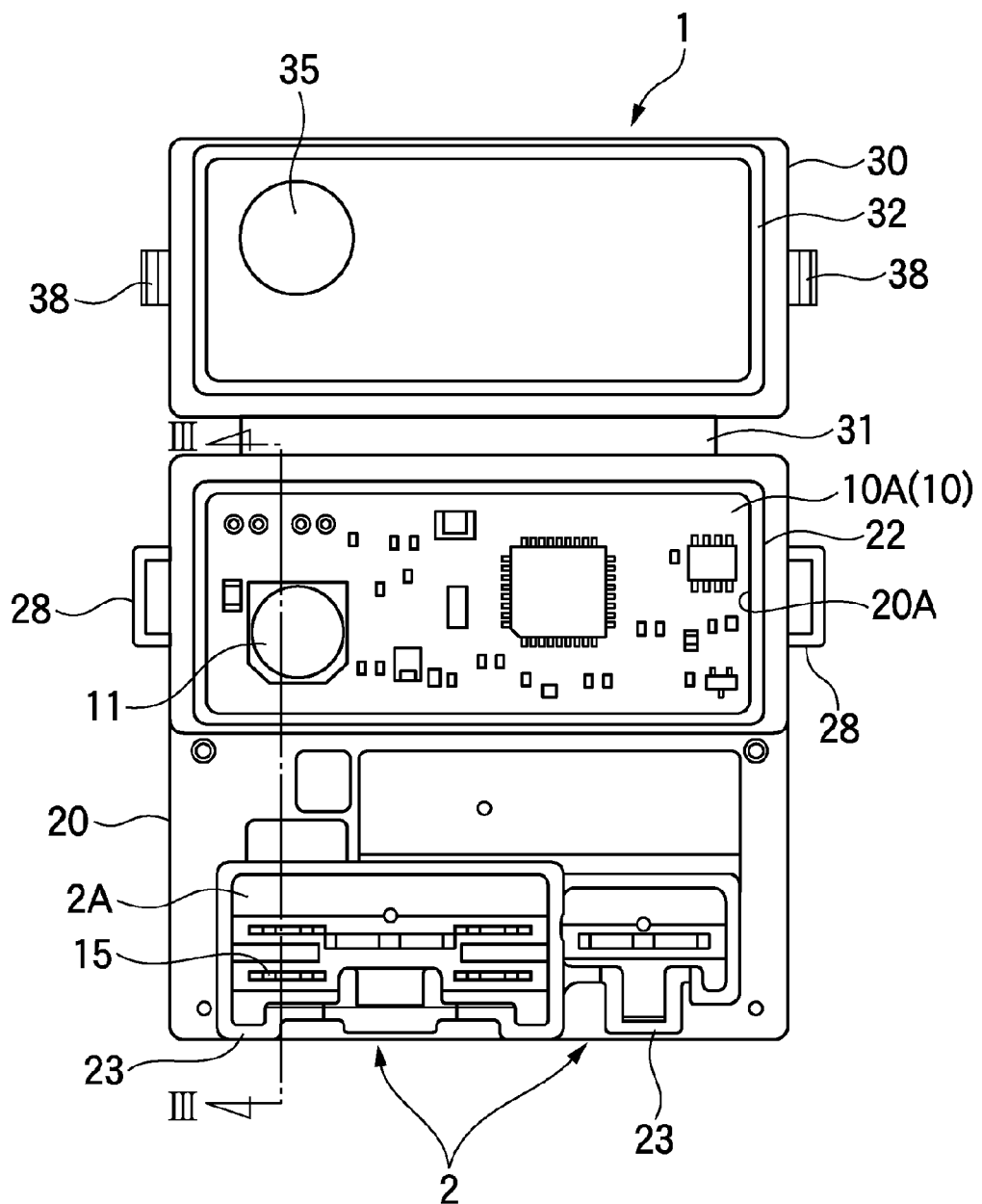
FIG. 2A is a top view illustrating configuration of the electronic circuit unit according to the first embodiment.
Figure 2B:
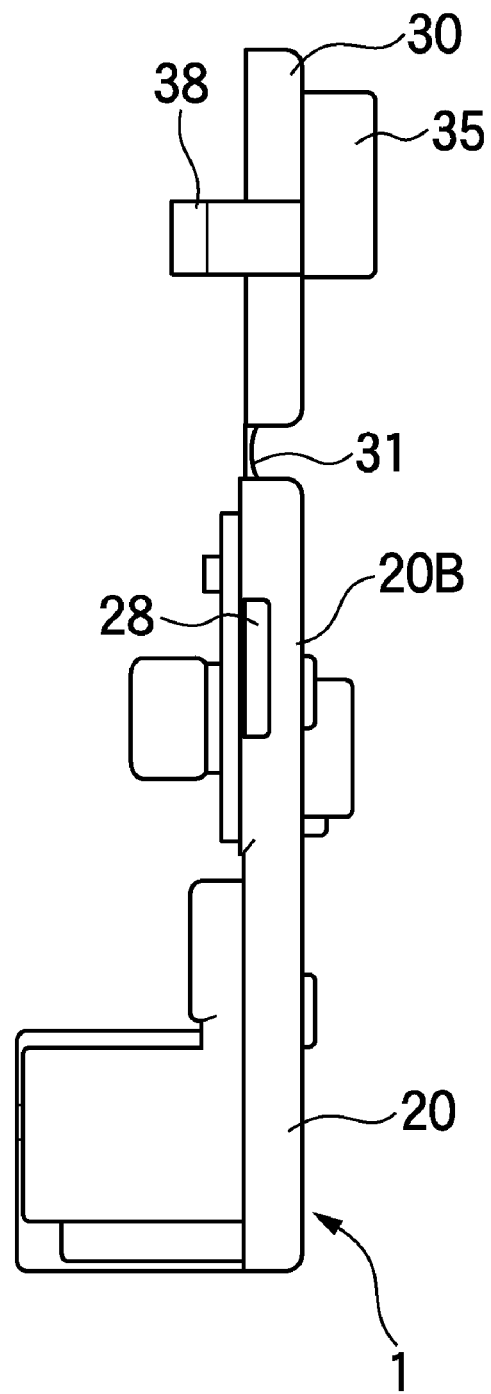
FIG. 2B is a side view illustrating configuration of the electronic circuit unit according to the first embodiment.
Figure 2C:
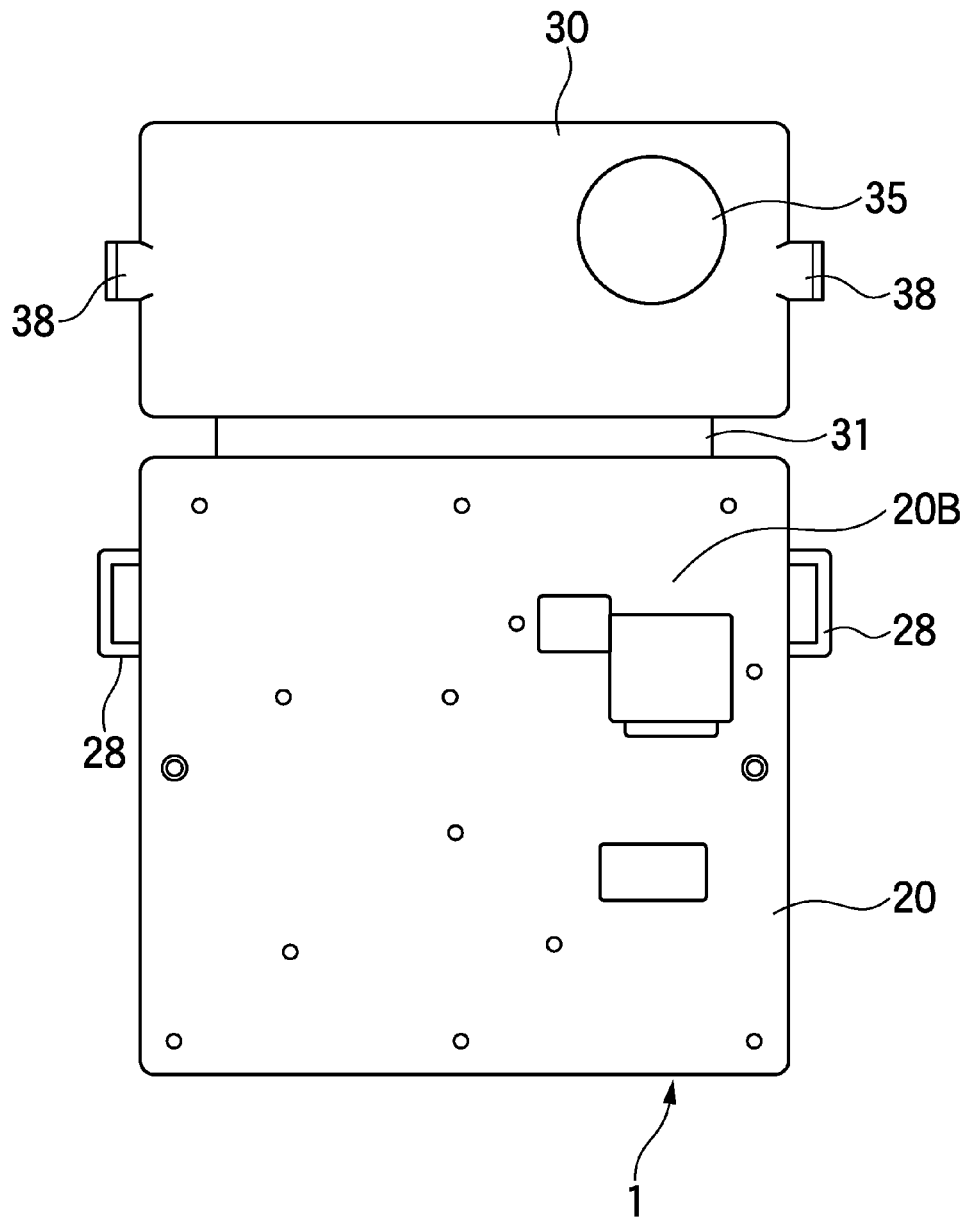
FIG. 2C is a bottom view illustrating configuration of the electronic circuit unit according to the first embodiment.

FIG. 1 is an external perspective view of an electronic circuit unit according to the first embodiment. FIGS. 2A to 2C are configuration diagrams of the electronic circuit unit, wherein FIGS. 2A, 2B and 2C are a top view, a side view and a bottom view of the unit, respectively. FIG. 3 is a sectional view taken along line in FIG. 2A.

As shown in FIGS. 1 to 2C, the electronic circuit unit 1 according to the first embodiment is configured in a manner that a mold exclusion part 10A is provided at a part of a plate surface of a rectangular circuit board 10 which mounts electronic components 11 thereon and is covered in its whole circumference by an outer case 20 formed by mold resin. In the mold exclusion part, a rear surface side is covered by the mold resin, and a front surface side is not covered by the mold resin but exposed from the outer case 20.

A connector housing 23 constituting a connector 2 is integrally formed with the outer case 20 of the electronic circuit unit 1. The connector housing 23 is projected from a front surface side of the circuit board 10 in a direction perpendicular to the circuit board 10. Further, the outer case 20 is provided with a lid 30 which is positioned away from the connector 2 and is freely opening and closing via a thin hinge 31 so as to integrally cover the mold exclusion part 10A.

The mold exclusion part 10A of the circuit board 10 is a portion on the front surface side of the circuit board 10 where the electronic components (for example, an electrolytic capacitor, an oscillator, a filter, etc.) 11 are arranged collectively. Each of these electronic components is intolerant of a pressure of the resin for molding at a time of forming the outer case 20 by injection molding. The mold exclusion part is disposed close to the lid 30. In a product stage, the mold exclusion part 10A is exposed outside from an opening 20A provided at the outer case 20. A circumferential edge of the opening 20A hangs over the front surface side of the circuit board 10 and is formed as a fitting frame 22 in which a convex frame 32 provided at an inner surface of the lid 30 fits.

Further, as shown in FIG. 3, the rear surface side of the mold exclusion part 10A is covered by the mold resin constituting a rear wall of the outer case 20. A. part 20B on the rear wall of the outer case 20 located on the rear surface side of the mold exclusion part 10A (hereinafter called "a rear wall of the mold exclusion part") is constituted of thermoplastic resin different from that of other portion 20C constituting the outer case 20.

That is, the other portion (mainly a portion except for the rear wall 20B of the mold exclusion part) 20C of the outer case 20 is constituted of polybutylene terephthalate (PBT) as engineering plastic, which can exhibit high rigidity, high heat-resistance, etc. as industrial products and is obtainable at a low cost. However, only the rear wall 20B of the mold exclusion part (or a limited portion containing at least the rear wall 20B of the mold exclusion part) is constituted of resin, such as liquid crystal polymer (LCP), having a fluidity in a molten state higher than that of the resin (PBT, etc.) constituting the other portion 20C of the outer case 20. This is because a pressure due to the resin for the injection molding can be reduced by employing the resin with a high fluidity.

In this manner, the outer case 20 is formed by two-color molding using the two kinds of resin having different fluidities. Of course, a combination of other kinds of resin can be selected so long as a condition, in which resin constituting the rear wall 20B of the mold exclusion part has a fluidity higher than that of resin constituting the other portion 20C of the outer case 20, is satisfied.

Further, as shown in FIGS. 1 to 2C, engagement parts 28 are provided at plural suitable portions of the circumferential periphery of the opening 20A of the outer case 20, respectively. These engagement parts respectively engage with lock parts 38 of the lid 30 side when the opening 20A is closed by the lid 30 to lock the lid 30 at a closed position. Further, for example, in a case where the electronic component 11 of a large height is mounted on the circuit board 10, the lid 30 is provided with a component housing 35 which can house a head portion of this electronic component. By doing so, an entire mounting height of the lid 30 can be made low.

Further, as shown in FIG. 3, plural layers (although two layers are schematically shown in FIG. 3, the number of the layers is optional) of conductor wring patterns 12 formed by copper foil are provided in an inner layer of the circuit board 10 (also containing a front surface layer of the board, if required). Respective terminals of the electronic components (one of them is shown by the symbol 11) mounted on the front and rear surface sides of the circuit board 10 are electrically connected to the predetermined conductor wring patterns 12.

Further, at predetermined portions of the circuit board 10, respective base ends of connector terminals 15 extending to a direction crossing the circuit board 10 (to the front surface side of the circuit board 10) are connected to the predetermined conductor wring patterns 12. In this case, for example, a press-fit terminal, easily connectable to the conductor wring pattern 12 by being pressed into the circuit board 10, is used as each of the connector terminals 15.

Next, a manufacturing method of the electronic circuit unit 1 (in particular, a molding method of the outer case 20) will be explained.

In a case of molding the outer case 20 of the electronic circuit unit 1, the connector terminals 15 are attached to the predetermined portions of the circuit board 10 in advance and then the circuit board 10 is set within a die 100 shown by an alternate long and two short dashes line in FIG. 3. At this time, the mold exclusion part 10A is exposed outside (or in a non-cavity space which is secured under a condition of not being filled with the resin even within the die 100) from an opening 100A of the die 100. Then, molten resin is filled in a cavity (a space in which the resin constituting the outer case 20 is filled in FIG. 3) within the die 100 to form the outer case 20.

As the rear surface side of the mold exclusion part 10A is intended to be covered by the resin, the molten resin is also filled in a cavity constituting this portion (the rear surface wall 20B of the mold exclusion part). However, the molten resin is not filled on the front surface side of the mold exclusion part 10A.

Thus, due to unbalance between respective forces on the front and rear surface sides of the circuit board 10, at the time of filling the molten resin, a force P directed toward the front surface side from the rear surface side acts on the circuit board 10 of the mold exclusion part 10A due to a pressure of the resin. If this force P acts excessively, the circuit board 10 is deformed and hence the conductor wring patterns 12 on the inner layer of the circuit board 10 and the electronic components 11 may be damaged.

Thus, according to the manufacturing method of the electronic circuit unit 1, only the portion containing the rear wall 20B of the mold exclusion part is molded by the resin having the fluidity higher than that of the resin constituting the other portion of the outer case 20. This is because the pressure of the resin (a filling pressure of the molten resin) acting on the circuit board 10 for the injection molding can be reduced by employing the resin with a high fluidity.

Actual molding is performed by the two-color molding. For example, an area represented by H1 in FIG. 3 is molded by polybutylene terephthalate (PBT) using a primary mold.

By doing so, the other portion 20C of the outer case 20 except for the rear wall 20B of the mold exclusion part can be molded. Next, an area represented by H2 in FIG. 3 is molded by liquid crystal polymer (LCP) having the higher fluidity using a secondary mold. By doing so, the portion containing the rear wall 20B of the mold exclusion part can be molded in a state of being combined integrally with the other portion 20C of the outer case 20. The primary and secondary molds maybe reversed according to a molding condition. Although the primary and secondary molds may be prepared independently, these molds may be prepared by moving a core in the same mold.

Further, when the injection molding is performed in this manner, the circumferential peripheries of the connector terminals 15 is surrounded by the cylindrical connector housing 23, and thus the connector 2 is constituted. Then, as shown in FIG. 3, an inner wall 24 for fixing the base ends of the connector terminals 15 thereto is formed at an inner portion of a fitting space 2A for a counterpart connector secured within the cylindrical connector housing 23. By doing so, even in a case where the press-fit terminals are used as the connector terminals 15, the connector terminals 15 can be firmly held and fixed. Thus, even if a prying force acts on the connector terminals 15 at a time of fitting the counterpart connector, the connector terminals can exhibit high durability.

As the electronic circuit unit 1 and the manufacturing method thereof are arranged in the aforesaid manner, a pressure due to the resin for the injection molding of the outer case 20, acting on the circuit board 10 of the mold exclusion part 10A, can be reduced. Thus, deformation of the circuit board 10 due to the pressure of the resin can be suppressed, and hence damage of the circuit board 10 and the electronic components 11 can be suppressed. Further, as the outer case 20 is formed by the two-color molding using the plural kinds of resin having different fluidities, specific properties of the respective resin can be utilized at the respective portions of the outer case 20 while suppressing an entire cost.

Further, according to the first embodiment, as the connector housing 23 is integrally molded with the outer case 20, the connector is not required to be assembled independently.

Further, as the lid 30 integrally covering the mold exclusion part 10A is molded with the outer case 20 via the hinge 31, the mold exclusion part 10A can be protected by the lid 30 without increasing the number of the components.

Incidentally, the invention is not limited to the first embodiment described above and can be suitably modified and improved, for example. In addition, the material, shape, size, number, arrangement position, etc. of each of the constituent elements in the first embodiment are not particularly limited and may be set optionally so long as the invention can be achieved.

For example, although the first embodiment is explained as to the case where the outer case 20 is formed by the two-color molding, the respective potions of the outer case 20 may be multi-material molded using many kinds of resin.

Hereinafter, the second embodiment according to the invention will be explained with reference to drawings.

Figure 5A:
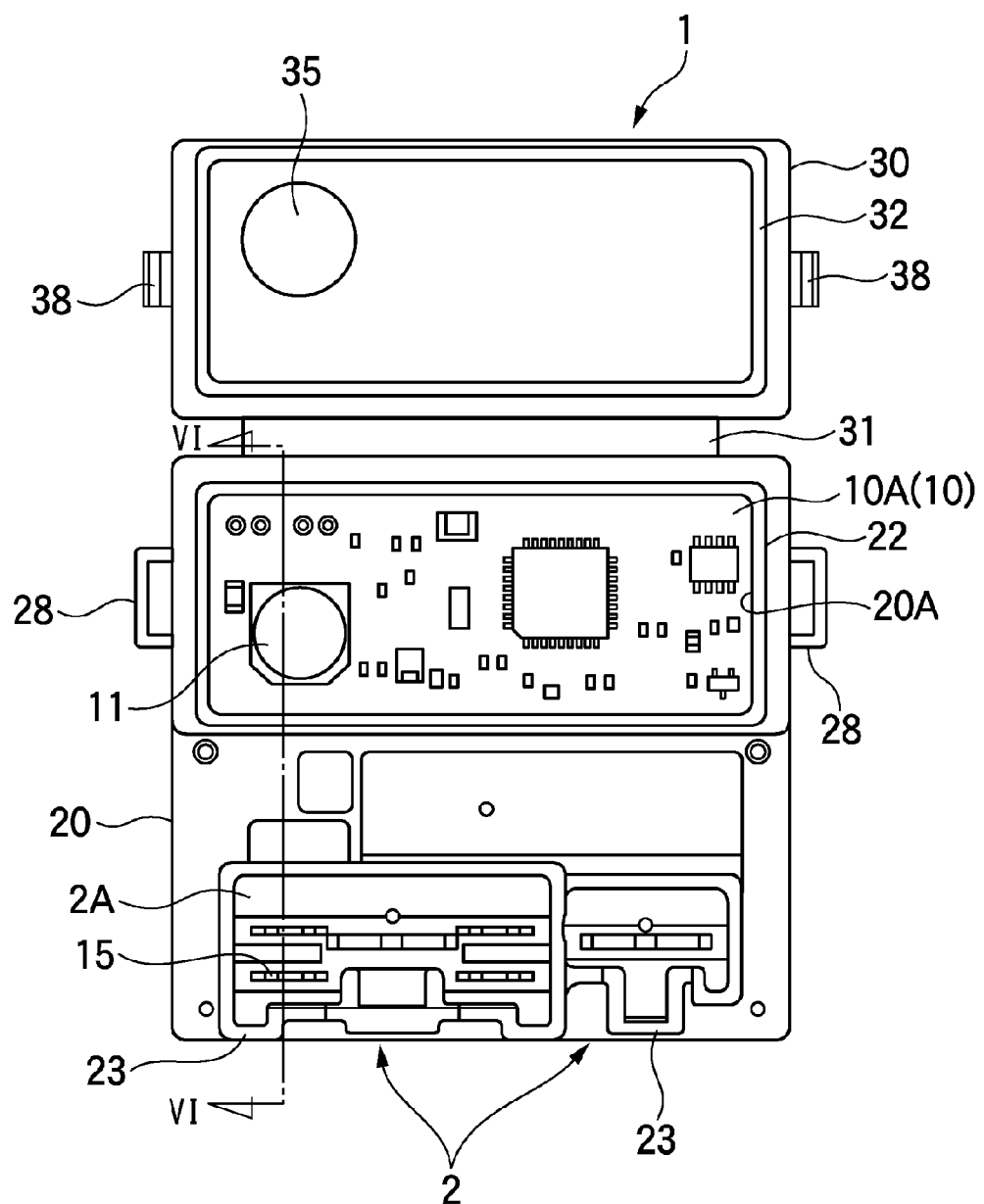
FIG. 5A is a top view illustrating configuration of the electronic circuit unit according to the second embodiment.
Figure 5B:
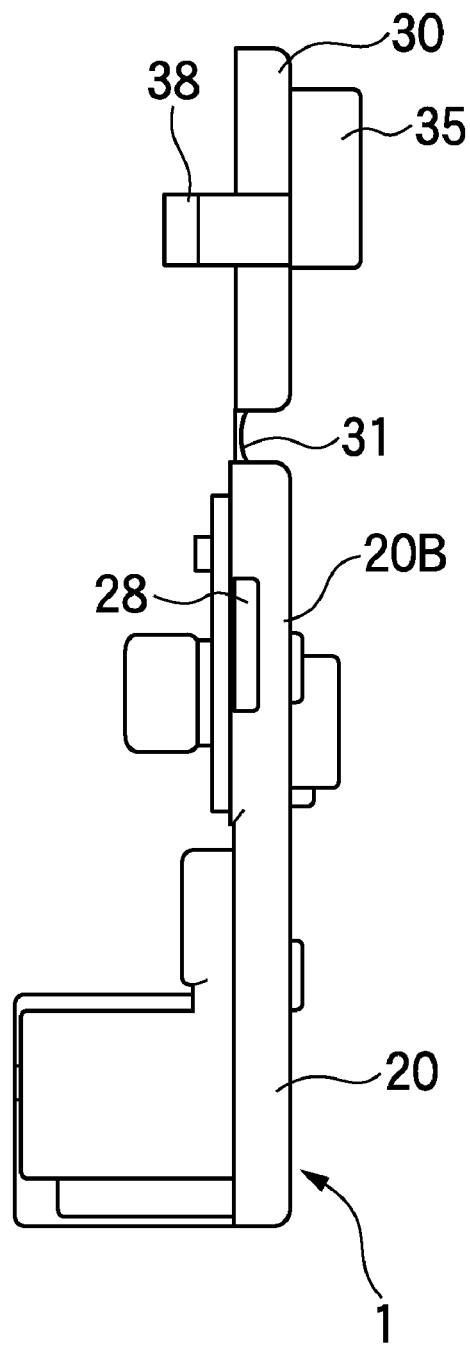
FIG. 5B is a side view illustrating configuration of the electronic circuit unit according to the second embodiment.
Figure 5C:
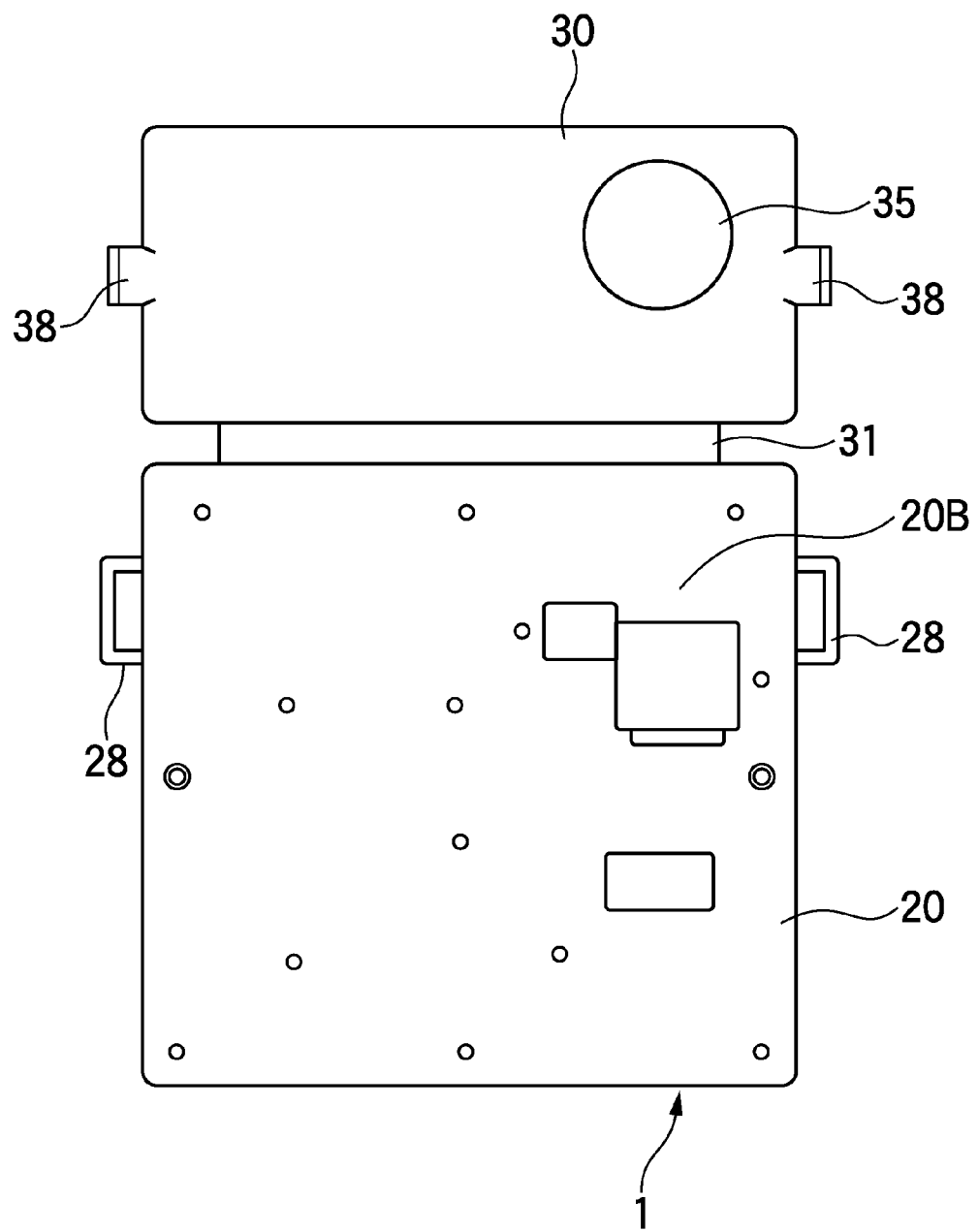
FIG. 5C is a bottom view illustrating configuration of the electronic circuit unit according to the second embodiment.

FIG. 4 is an external perspective view of an electronic circuit unit according to the second embodiment. FIGS. 5A to 5C are configuration diagrams of the electronic circuit unit, wherein FIGS. 5A, 5B and 5C are a top view, a side view and a bottom view of the unit, respectively. FIG. 6 is a sectional view taken along line VI-VI in FIG. 5A.

As shown in FIGS. 5 to 6C, the electronic circuit unit 1 according to the second embodiment is configured in a manner that a mold exclusion part 10A is provided at a part of a plate surface of a rectangular circuit board 10 which mounts electronic components 11 thereon and is covered in its whole circumference by an outer case 20 formed by mold resin. In the mold exclusion part, a rear surface side is covered by the mold resin, and a front surface side is not covered by the mold resin but exposed from the outer case 20.

A connector housing 23 constituting a connector 2 is integrally formed with the outer case 20 of the electronic circuit unit 1. The connector housing 23 is projected from a front surface side of the circuit board 10 in a direction perpendicular to the circuit board 10. Further, the outer case 20 is provided with a lid 30 which is positioned away from the connector 2 and is freely opening and closing via a thin hinge 31 so as to integrally cover the mold exclusion part 10A.

The mold exclusion part 10A of the circuit board 10 is a portion on the front surface side of the circuit board 10 where the electronic components (for example, an electrolytic capacitor, an oscillator, a filter, etc.) 11 are arranged collectively. Each of these electronic components is intolerant of a pressure of the resin for molding at a time of forming the outer case 20 by injection molding. The mold exclusion part is disposed close to the lid 30. In a product stage, the mold exclusion part 10A is exposed outside from an opening 20A provided at the outer case 20. A circumferential edge of the opening 20A hangs over the front surface side of the circuit board 10 and is formed as a fitting frame 22 in which a convex frame 32 provided at an inner surface of the lid 30 fits.

The rear surface side of the mold exclusion part 10A is covered by the mold resin constituting a rear wall of the outer case 20. A part 20B (hereinafter also called "a rear wall of the mold exclusion part") on the rear wall of the outer case 20 located on the rear surface side of the mold exclusion part 10A is constituted of thermoplastic resin like other portion constituting the rear surface wall.

As an example of the thermoplastic resin in this case, polybutylene terephthalate (PBT) as engineering plastic, which can exhibit high rigidity, high heat-resistance, etc. as industrial products and is obtainable at a low cost, is used. Of course, other engineering plastic capable of exhibiting the similar performance may be used.

Engagement parts 28 are provided at suitable plural portions of the circumferential periphery of the opening 20A of the outer case 20, respectively. These engagement parts respectively engage with lock parts 38 of the lid 30 side when the opening 20A is closed by the lid 30 to lock the lid 30 at a closed position. Further, for example, in a case where the electronic component 11 of a large height is mounted on the circuit board 10, the lid 30 is provided with a component housing 35 which can house a head portion of this electronic component. By doing so, an entire mounting height of the lid 30 can be made low.

As shown in FIG. 6, plural layers (although two layers are schematically shown in FIG. 6, the number of the layers is optional) of conductor wring patterns 12 formed by copper foil are provided on an inner layer of the circuit board 10 (also containing a front surface layer of the board, if required). Respective terminals of the electronic components (one of them is shown by the symbol 11) mounted on the front and rear surface sides of the circuit board 10 are electrically connected to the predetermined conductor wring patterns 12.

Further, as a strength increasing part for suppressing the deformation of the circuit board 10 due to the pressure of the resin for the injection molding of the outer case 20, the inner layer of the circuit board 10 at the mold exclusion part 10A (also containing the front surface of the circuit board according to a situation) is provided with a dummy reinforcement conductor pattern 12A not having a function as a conductor wiring part. The dummy reinforcement conductor pattern 12A is constituted of, for example, a solid pattern of copper foil.

Further, at predetermined portions of the circuit board 10, respective base ends of connector terminals 15 extending to a direction crossing the circuit board 10 (to the front surface side of the circuit board 10) are connected to the predetermined conductor wring patterns 12. In this case, for example, a press-fit terminal, easily connectable to the conductor wring pattern 12 by being pressed into the circuit board 10, is used as each of the connector terminals 15.

In a case of molding the outer case 20 of the electronic circuit unit 1, the connector terminals 15 are attached to the predetermined portions of the circuit board 10 in advance and then the circuit board 10 is set within a die 100 shown by an alternate long and two short dashes line in FIG. 6. At this time, the mold exclusion part 10A is exposed outside (or in a non-cavity space which is secured under a condition of not being filled with the resin even within the die 100) from an opening 100A of the die 100. Then, molten resin is filled in a cavity (a space in which the resin constituting the outer case 20 is filled in FIG. 6) within the die 100 to form the outer case 20.

As the rear surface side of the mold exclusion part 10A is intended to be covered by the resin, the molten resin is also filled in a cavity constituting this portion (the rear wall 20B of the mold exclusion part). However, the molten resin is not filled on the front surface side of the mold exclusion part 10A.

Thus, due to unbalance between respective forces acting on the front and rear surface sides of the circuit board 10, at the time of filling the molten resin, a force P directed toward the front surface side from the rear surface side acts on the circuit board 10 at the mold exclusion part 10A due to a pressure of the resin. If this force P acts excessively, the circuit board 10 is deformed and hence the conductor wring patterns 12 on the inner layer of the circuit board 10 and the electronic components 11 may be damaged.

However, in the electronic circuit unit 1 according to the second embodiment, as the dummy reinforcement conductor pattern 12A acting as the strength increasing part is provided in the inner layer of the circuit board 10 at the mold exclusion part 10A, the outer case 20 can be formed by the injection molding while suppressing the deformation of the circuit board 10 due to the pressure of the resin. Thus, damage of the circuit board 10 and the electronic components 11 upon the injection molding of the outer case 20 can be suppressed.

Further, in the second embodiment, as heat radiation property is improved by providing the dummy reinforcement conductor pattern 12A, heat-generation suppression effect of the circuit board 10 can be enhanced. In particular, in the case where the solid pattern of copper foil is provided as the dummy reinforcement conductor pattern 12A, further heat-generation suppression effect can be exhibited.

Further, the connector 2 is configured by surrounding the circumferential peripheries of the connector terminals 15 with the cylindrical connector housing 23. As shown in FIG. 6, an inner wall 24 for fixing the base ends of the connector terminals 15 thereto is formed at an inner portion of a fitting space 2A for a counterpart connector secured within the cylindrical connector housing 23. By doing so, even in a case where the press-fit terminals are used as the connector terminals 15, the connector terminals 15 can be firmly held and fixed. Thus, even if a prying force acts on the connector terminals 15 at a time of fitting the counterpart connector, the connector terminals can exerts high durability.

Further, according to the second embodiment, as the connector housing 23 is integrally molded with the outer case 20, the connector is not required to be assembled independently.

Further, as the lid 30 covering the mold exclusion part 10A is provided with the outer case 20 via the hinge 31, the mold exclusion part 10A can be integrally protected by the lid 30 without increasing the number of the components.

Next, an electronic circuit unit according to the third embodiment of the invention will be explained.

FIG. 7 is a sectional view of a portion, similar to that shown in FIG. 6, of the electronic circuit unit according to the third embodiment.

In the second embodiment described above, as the strength increasing part, the dummy reinforcement conductor pattern 12A is provided in the inner layer of the mold exclusion part 10A. In the electronic circuit unit according to the third embodiment, as shown in FIG. 7, a thickness increasing part 12B, formed by locally increasing a thickness of the conductor wring pattern 12, is provided at a part of the conductor wring pattern 12 on the inner layer of the circuit board 10 at the mold exclusion part 10A, as a strength increasing part.

The thickness increasing part 12B of the conductor wring pattern 12 is formed by locally increasing a thickness of the copper foil at a portion of the pattern where an elastic modulus is supposed to reduce. This thickness increasing part 12B can be formed using a build-up manufacturing method, for example. As the configuration of the other constituent elements is same as that of the second embodiment, the explanation thereof is omitted.

In this manner, the thickness increasing part 12B formed by locally increasing the thickness of the conductor wring pattern 12 is provided as the strength increasing part. Thus, by merely changing the thickness of a part of the conductor wring pattern 12, the outer case 20 can be formed by the injection molding while suppressing the deformation of the circuit board 10 due to the pressure of the resin for the injection molding of the outer case 20. As a result, the damage of the circuit board 10 and the electronic components 11 upon the injection molding of the outer case 20 can be suppressed.

In each of the second and third embodiments described above, it is sufficient so long as the strength increasing part is provided at a portion of the circuit board 10 at the mold exclusion part 10A having an elastic modulus smaller than that of the other portion at the mold exclusion part 10A.

Figure 8:
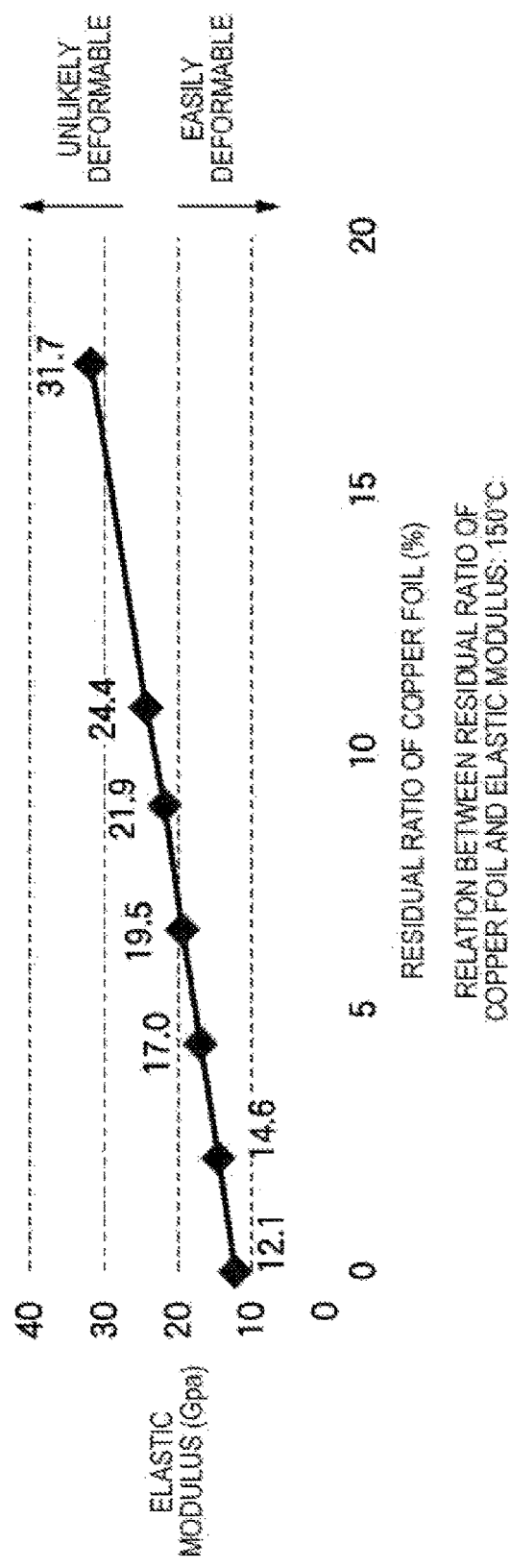
FIG. 8 is a characteristic diagram showing a relation between a residual ratio of copper foil constituting conductor wring patterns of an inner layer of the circuit board and an elastic modulus of the circuit board.

As shown in FIG. 8, the elastic modulus of the circuit board 10 is proportional to a residual ratio of the copper foil constituting the conductor wring patterns 12 (for example, a ratio of the portions, where the copper foil is remained as the wring patterns by an etching process, with respect to the entire area). Thus, it will be understood that an area not remaining the conductor wring pattern 12 or an area low in a density of the conductor wring patterns 12 (a portion having a narrow copper foil, a portion having a thin copper foil, etc.) is easily deformed. Preferably, the strength increasing part is provided aiming at these areas. Alternatively, as the elastic modulus reduces as the temperature increases, the strength increasing part may be provided at an area where heat is likely confined upon the molding.

In this respect, as the die 100 is attached firmly to the circumferential edge of the mold exclusion part 10A and applies a pressing force thereto, the strength increasing part is preferably provided at a portion having a low elastic modulus in the center area of the mold exclusion part 10A. By doing so, the deformation of the circuit board 10 can be prevented effectively and the damage of the conductor wring patterns 12 and the electronic components 11 can be avoided.

Incidentally, the invention is not limited to the second and third embodiments described above and can be suitably modified and improved, for example. In addition, the material, shape, size, number, arrangement position, etc. of each of the constituent elements in the second and third embodiments are not particularly limited and may be set optionally so long as the invention can be achieved.

For example, although the dummy reinforcement conductor pattern 12A of the second embodiment is provided as the solid pattern of copper foil, the dummy reinforcement conductor pattern 12A may be provided only at a portion where an elastic modulus is supposed to be low. Further, the thickness increasing part 12B of the third embodiment may be provided at plural portions where an elastic modulus is supposed to be low.

Herein the features of the embodiments of the electronic circuit unit and the manufacturing method thereof according to the invention will be briefly summarized and listed below in (1) to (9).

(1) An electronic circuit unit (1) in which a mold exclusion part (10A), having a rear surface side covered by mold resin and a front surface side exposed from an outer case, is provided at a part of a plate surface of a circuit board (10) which is mounted with electronic components (11) and is covered by the outer case (20) formed by the mold resin, wherein the outer case is multi-material molded using plural kinds of resin having different fluidities, and wherein a rear wall (a rear wall 20B of the mold exclusion part) of the outer case located on the rear surface side of the mold exclusion part is made of the resin having a fluidity higher than that of the resin constituting the other portion (20C) of the outer case.

(2) The electronic circuit unit (1) described in the feature (1), wherein a connector housing (23) is integrally provided with the outer case.

(3) The electronic circuit unit (1) described in the feature (1) or (2), wherein a lid (30) which integrally covers the mold exclusion part is provided with the outer case via a hinge (31).

(4) An electronic circuit unit (1) in which a mold exclusion part (10A), having a rear surface side covered by mold resin and a front surface side exposed from an outer case, is provided at a part of a plate surface of a circuit board (10) which is mounted with electronic components (11) and is covered by the outer case (20) formed by the mold resin, wherein a strength increasing part (12A or 12B) is provided at an inner layer in the mold exclusion part of the circuit board for suppressing deformation of the circuit board due to a pressure of resin in injection molding of the outer case.

(5) The electronic circuit unit (1) described in the feature (4), wherein a reinforcement conductor pattern (12A) not having a function as a conductor wiring part is provided at the inner layer in the mold exclusion part of the circuit board, as the strength increasing part.

(6) The electronic circuit unit (1) described in the feature (4), wherein a thickness increasing part (12B) is provided at a part of conductor wring pattern located on the inner layer in the mold exclusion part of the circuit board, as a strength increasing part, and wherein the thickness increasing part is in which a thickness of the conductor wring pattern increases locally.

(7) The electronic circuit unit (1) described in one of the features (4) to (6), wherein a connector housing (23) is integrally provided with the outer case.

(8) The electronic circuit unit (1) described in one of the features (4) to (7), wherein a lid (30) which integrally covers the mold exclusion part is provided with the outer case via a hinge (31).

(9) A manufacturing method for an electronic circuit unit (1) in which a mold exclusion part (10A), having a rear surface side covered by mold resin and a front surface side exposed from an outer case, is provided at a part of a plate surface of a circuit board (10) which is mounted with electronic components (11) and is covered by the outer case (20) formed by the mold resin, the manufacturing method comprising:

setting the circuit board within a die (100); and multi-material molding the outer case using plural kinds of resin having different fluidities at a time of filling molten resin in a cavity within the die for injection molding the outer case, wherein one of the plural kinds of the resin having a fluidity higher than a fluidity of another one of the plural kinds of the resin constituting the other portion (20C) of the outer case is used, as the resin constituting a rear wall (a rear wall 20B of the mold exclusion part) of the outer case located on the rear surface side of the mold exclusion part.

A detailed description has been given of the invention referring to the specific embodiments, but it will be understood by those skilled in the art that various changes and modifications can be made without departing from the spirit and scope of the invention.

According to the invention, the deformation of the circuit board due to the pressure of the resin can be suppressed and the damage of the circuit board and the electronic circuit can be suppressed. Further, as the outer case is formed by the multi-material molding using the plural kinds of resin having different fluidities, specific properties of the respective resin can be utilized at the respective portions of the outer case while suppressing the entire cost. Further, according to the invention, as the strength increasing part is provide on the inner layer in the mold exclusion part of the circuit board, the deformation of the circuit board due to the pressure of the resin for the injection molding of the outer case can be suppressed and the damage of the circuit board and the electronic components can be suppressed. The invention achieving such the effect is usable for the electronic circuit unit and the manufacturing method thereof in which the outer case is formed by the mold resin integrally with the circuit board.

REFERENCE SIGNS LIST

1 electronic circuit unit
10 circuit board
10A mold exclusion part
11 electronic component
12 conductor wring pattern
12A dummy reinforcement conductor pattern (strength increasing part)
12B thickness increasing part (strength increasing part)

20 outer case
20B rear wall of mold exclusion part
20C other portion of outer case
23 connector housing
30 lid
31 hinge

What is claimed is:

1. An electronic circuit unit comprising:
a circuit board having a plate surface;
electronic components mounted on the plate surface of the circuit board; and
an outer case formed on the circuit board by a mold resin, wherein
the circuit board includes a mold exclusion part having a rear surface side covered by the mold resin and a front surface side exposed from the outer case, the front surface side includes a part of the plate surface of the circuit board which is mounted with the electronic components, and a perimeter of the mold exclusion part is covered by the outer case formed by the mold resin, wherein
the outer case is multi-material molded using plural kinds of resin having different fluidities, and wherein
a rear wall of the outer case includes a first portion that covers the rear surface side of the mold exclusion part and a second portion that abuts the first portion, the first portion is made of one of the plural kinds of the resin having a fluidity higher than a fluidity of another one of the plural kinds of the resin constituting the second portion of the outer case,
the mold resin that covers the perimeter of the mold exclusion part is the one of the plural kinds of the resin having the higher fluidity, and
the outer case includes a front portion that covers a portion of the plate surface of the circuit board that is spaced apart from the mold exclusion part, and the front portion is made from the another one of the plural kinds of resin.

2. The electronic circuit unit according to claim 1, wherein a connector housing is integrally provided with the outer case.

3. The electronic circuit unit according to claim 1, wherein a lid which integrally covers the mold exclusion part is provided with the outer case via a hinge.

4. An electronic circuit unit comprising:
a circuit board having a plate surface;
electronic components mounted on the plate surface of the circuit board; and
an outer case formed on the circuit board by a mold resin, wherein
the circuit board includes a mold exclusion part having a rear surface side covered by the mold resin and a front surface side exposed from the outer case, the front surface side includes a part of the plate surface of the circuit board which is mounted with the electronic components, and a perimeter of the mold exclusion part is covered by the outer case formed by the mold resin, wherein
a strength increasing part is contained inside of the mold exclusion part of the circuit board as an inner layer of the circuit board for suppressing deformation of the circuit board due to a pressure of resin in injection molding of the outer case.

5. The electronic circuit unit according to claim 4, wherein a dummy reinforcement conductor pattern not having a function as a conductor wiring part is provided at the inner layer in the mold exclusion part of the circuit board, as the strength increasing part.

6. The electronic circuit unit according to claim 4, wherein a thickness increasing part is provided at a part of conductor wiring pattern located on the inner layer in the mold exclusion part of the circuit board, as a strength increasing part, and wherein
the thickness increasing part is in which a thickness of the conductor wring pattern increases locally.

7. The electronic circuit unit according to claim 4, wherein a connector housing is integrally provided with the outer case.

8. The electronic circuit unit according to claim 4, wherein a lid which integrally covers the mold exclusion part is provided with the outer case via a hinge.

9. A manufacturing method for an electronic circuit unit that includes a circuit board having a plate surface, a rear surface, and a mold exclusion part that includes first portion of the plate surface and a first portion of the rear surface, electronic components mounted on the first portion of the plate surface, and an outer case, the manufacturing method comprising:
setting the circuit board within a die; and
multi-material molding the outer case using plural kinds of resin having different fluidities at a time of filling molten resin in a cavity within the die for injection molding the outer case, wherein
multi-material molding the outer case includes,
molding with one of the plural kinds of the resin having a fluidity higher than a fluidity of another one of the plural kinds of the resin a first portion of the outer cover onto the first portion of the rear surface and onto the plate surface such that the first portion of the outer cover exposes the first portion of the plate surface from the outer cover, and
molding with the another one of the plural kinds of the resin a second portion of the outer cover onto a second portion of the rear surface that is adjacent to the first portion of the rear surface.

* * * * *